United States Patent
Wang et al.

(10) Patent No.: US 10,955,297 B2
(45) Date of Patent: Mar. 23, 2021

(54) SYSTEMS AND METHODS FOR MONITORING JUNCTION TEMPERATURE OF A SEMICONDUCTOR SWITCH

(71) Applicant: General Electric Company, Schenectady, NY (US)

(72) Inventors: Ruxi Wang, Cohoes, NY (US); Peter Almern Losee, Clifton Park, NY (US); Juan Antonio Sabate, Wilton, NY (US); Krishna Mainali, Schenectady, NY (US); Tomas Sadilek, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 356 days.

(21) Appl. No.: 16/002,769

(22) Filed: Jun. 7, 2018

(65) Prior Publication Data

US 2019/0376850 A1 Dec. 12, 2019

(51) Int. Cl.
*G01K 7/00* (2006.01)
*G01K 7/01* (2006.01)
*H01L 29/78* (2006.01)
*H01L 29/16* (2006.01)

(52) U.S. Cl.
CPC .......... *G01K 7/015* (2013.01); *H01L 29/1608* (2013.01); *H01L 29/7805* (2013.01)

(58) Field of Classification Search
USPC ....................................... 374/178, 163, 183
See application file for complete search history.

(56) References Cited

U.S. PATENT DOCUMENTS

| 7,332,358 | B2 | 2/2008 | Orr |
| 9,683,898 | B2 | 6/2017 | Sundaramoorthy et al. |
| 9,689,754 | B2 | 6/2017 | Thogersen et al. |
| 2013/0278298 | A1* | 10/2013 | Curbelo ............... H03K 17/163 327/109 |

(Continued)

FOREIGN PATENT DOCUMENTS

| CN | 105811944 A | 7/2016 |
| WO | 2017141743 A1 | 8/2017 |

OTHER PUBLICATIONS

H-M Chuang et al., "Temperature-dependent characteristics of polysilicon and diffused resistors", IEEE Transactions on Electron Devices, vol. 50, Issue: 5, pp. 1413-1415, May 2003.

(Continued)

*Primary Examiner* — Mirellys Jagan

(57) ABSTRACT

A system for monitoring a junction temperature of a semiconductor device includes a sensing resistor electrically coupled to a source terminal of the semiconductor device in a gate loop of the semiconductor device. The system includes a detection circuit electrically coupled to the gate loop of the semiconductor device and configured to measure a voltage difference across the sensing resistor. The system also includes an electronic control unit electrically coupled to the gate loop and the detection circuit. The electronic control unit is configured to determine a first gate current peak during a switching process of the semiconductor device, wherein the first gate current peak is determined based on the voltage detected by the detection circuit. The electronic control unit is configured to determine the junction temperature based on the first gate current peak.

21 Claims, 9 Drawing Sheets

(56) References Cited

U.S. PATENT DOCUMENTS

| | | | |
|---|---|---|---|
| 2013/0328596 A1* | 12/2013 | Zoels | H03K 17/18 327/109 |
| 2015/0358013 A1* | 12/2015 | Sakai | H03K 17/161 327/109 |
| 2016/0252402 A1 | 9/2016 | Singh | |
| 2016/0334280 A1 | 11/2016 | Hasan et al. | |
| 2018/0281600 A1* | 10/2018 | Zhou | B60L 53/14 |
| 2018/0366970 A1* | 12/2018 | Zhou | H02J 7/0034 |
| 2019/0131964 A1* | 5/2019 | Bryant | H03K 17/74 |
| 2020/0091906 A1* | 3/2020 | Kawai | H03K 17/145 |
| 2020/0091907 A1* | 3/2020 | Kawai | H03K 17/0822 |

OTHER PUBLICATIONS

Bhalla et al., "High voltage power MOSFET switching parameters: testing methods for guaranteeing datasheet limits", Alpha & Omega Semiconductor application note, May 20, 2009.

Musallam et al., "Real-Time Compact Thermal Models for Health Management of Power Electronics", IEEE Transactions on Power Electronics, vol. 25, Issue: 6, pp. 1416-1425, Jun. 2010.

Yang et al., "Condition Monitoring for Device Reliability in Power Electronic Converters: A Review", IEEE Transactions on Power Electronics, vol. 25, Issue: 11, pp. 2734-2752, Nov. 2010.

Chen et al., "Real-Time Temperature Estimation for Power MOSFETs Considering Thermal Aging Effects", IEEE Transactions on Device and Materials Reliability, vol. 14, Issue: 1, pp. 220-228, Mar. 2014.

Baker et al., "Online junction temperature measurement via internal gate resistance during turn-on", 2014 16th European Conference on Power Electronics and Applications, Aug. 26-28, 2014.

Baker et al., "Improved Reliability of Power Modules: A Review of Online Junction Temperature Measurement Methods", IEEE Industrial Electronics Magazine, vol. 8, Issue: 3, pp. 17-27, Sep. 2014.

"IPP60R040C7 600V CoolMOS™ C7 Power Transistor", Infineon, Retrieved from: https://www.infineon.com/dgdl/Infineon-IPP60R040C7-DS-v02_00-EN.pdf?fileId=5546d4624cb7f111014d479ac7c56893 on Mar. 22, 2018, pp. 1-15, May 8, 2015.

Baker et al., "IGBT junction temperature measurement via peak gate current", IEEE Transactions on Power Electronics, vol. 31, Issue: 5, pp. 3784-3793, May 2016.

Zhang et al., "Online junction temperature monitoring using turn-off delay time for silicon carbide power devices", Energy Conversion Congress and Exposition (ECCE), 2016 IEEE, pp. 1-7, Milwaukee, Sep. 18-22, 2016.

Xu et al., "Reliability odometer of power semiconductor device used for high performance high power amplifiers", 2016 IEEE Energy Conversion Congress and Exposition (ECCE), pp. 1-5, Milwaukee, Sep. 18-22, 2016.

Stella et al., "On-line Junction Temperature Estimation of SiC Power MOSFETs through On-state Voltage Mapping", IEEE Transactions on Industry Applications, Issue: 99, pp. 1-1, Mar. 6, 2018.

Griffo et al., "Real-Time Measurement of Temperature Sensitive Electrical Parameters in SIC Power MOSFETS", IEEE Transactions on Industrial Electronics, vol. 65, Issue: 3, pp. 2663-2671, Mar. 2018.

* cited by examiner

SYSTEMS AND METHODS FOR MONITORING JUNCTION TEMPERATURE OF A SEMICONDUCTOR SWITCH

BACKGROUND

The subject matter disclosed herein relates to semiconductor devices (e.g., semiconductor switches), and more specifically to monitoring a junction temperature of a semiconductor switch. Semiconductor-based systems may be used in a vast range of applications, including power electronics converters (e.g., for transportation equipment, construction equipment, mining equipment, oil and gas equipment, etc.), solar power converters, computing devices, variable frequency drives, electric cars, trains, refrigeration systems, HVAC systems (e.g., air conditioners), audio equipment (e.g., amplifiers, public address systems, etc.), and so forth. In such systems, the junction temperature of a semiconductor switch (e.g., an average temperature of an active semiconductor area) may be indicative of how the semiconductor switch is operating. However, direct measurements of the junction temperature (e.g., via optical measurements or direct contact measurements) may not be practical. For example, systems for direct junction temperature measurements may compromise the packaging of the semiconductor switch and/or substantially increase the footprint of the packaging of the semiconductor switch.

BRIEF DESCRIPTION

In one embodiment, a system for monitoring a junction temperature of a semiconductor device includes a sensing resistor electrically coupled to a source terminal of the semiconductor device in a gate loop of the semiconductor device. The system includes a detection circuit electrically coupled to the gate loop of the semiconductor device and configured to measure a voltage difference across the sensing resistor. The system also includes an electronic control unit electrically coupled to the gate loop and the detection circuit. The electronic control unit is configured to determine a first gate current peak during a switching process of the semiconductor device, wherein the first gate current peak is determined based on the voltage detected by the detection circuit. The electronic control unit is configured to determine the junction temperature based on the first gate current peak.

In another embodiment, a semiconductor switch device includes a gate driver configured to turn-on and turn-off the semiconductor switch device and includes a junction temperature monitoring system electrically coupled to the semiconductor switch device and configured to a monitor junction temperature of the semiconductor switch device. The junction temperature monitoring system includes a sensing resistor electrically coupled to a source terminal of the semiconductor switch device in a gate loop of the semiconductor switch device and includes a detection circuit electrically coupled to the gate loop of the semiconductor switch device and configured to measure a voltage difference across the sensing resistor. The junction temperature monitoring system also includes an electronic control unit electrically coupled to the gate loop and the detection circuit. The electronic control unit is configured to determine a first gate current peak driven by a gate driver during a switching process of the semiconductor switch device, wherein the first gate current peak is determined based on the voltage detected by the detection circuit. The electronic control unit is configured to determine the junction temperature based on the first gate current peak.

In another embodiment, a method of online monitoring a junction temperature of a semiconductor switch includes initiating at least one switching cycle of the semiconductor switch and logging gate voltage of the semiconductor switch during the at least one switching cycle. The method includes receiving an electrical signal from a detection circuit that is electrically coupled to a gate loop of the semiconductor switch, wherein the electrical signal is indicative of a voltage measured across a sensing resistor of the gate loop and is electrically coupled to a source terminal of the semiconductor switch. The method includes determining a first gate current peak based on the electrical signal and determining the junction temperature based on the first gate current peak.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
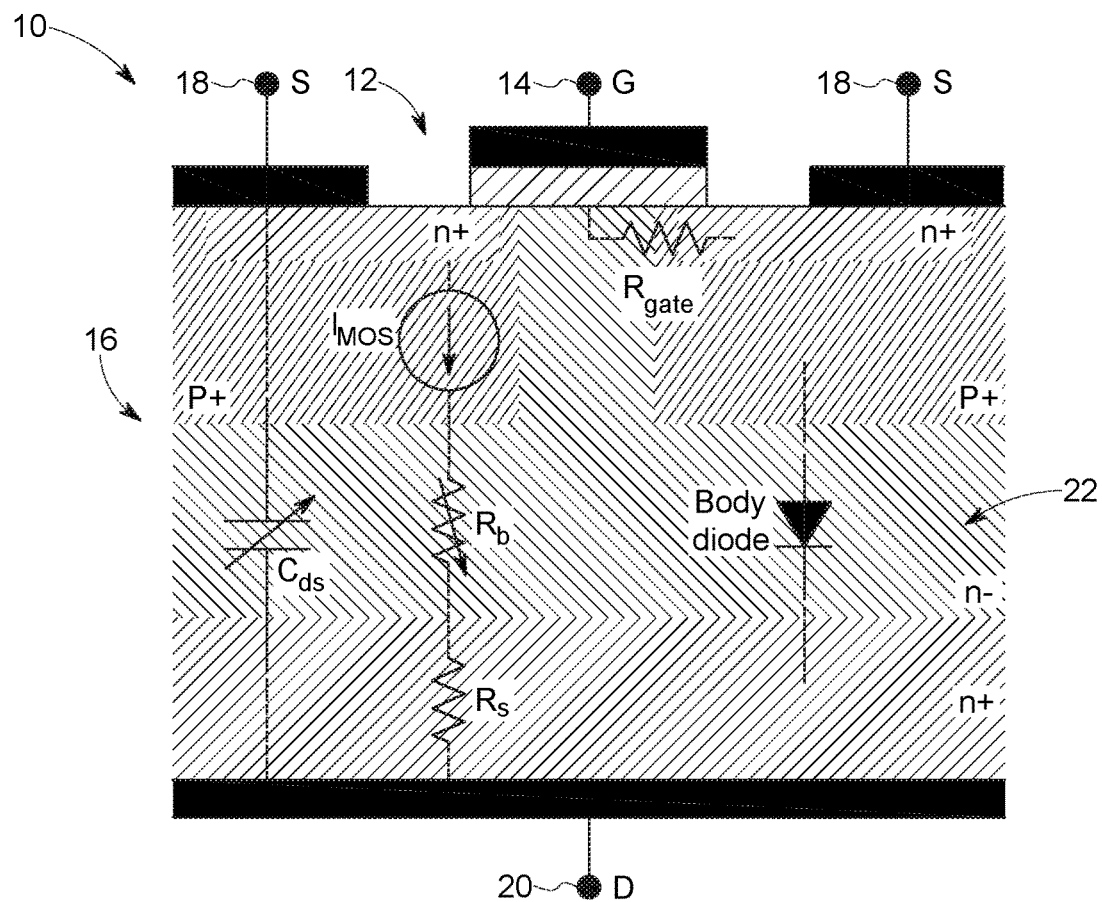
FIG. 1 is a cross-sectional view of a semiconductor device used in a power electronics system, in accordance with present embodiments.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The present disclosure generally encompasses systems and methods for monitoring a junction temperature, $T_j$, of a semiconductor device, such as a semiconductor switch. Because the performance of a semiconductor device is typically at least somewhat temperature sensitive, it is desirable to monitor the junction temperature of the semiconductor device (e.g., an average temperature of an active semiconductor area of a semiconductor device or switch) in order to maintain the junction temperature within a desirable range. For example, an accumulation of thermal stress at interfaces between materially different portions in a semiconductor device may lead to failure of the semiconductor device (e.g., wire bond fatigue/lift off or solder layer fatigue). For example, a semiconductor device may generate both conduction loss and switching loss during operation, and, thus, temperature and temperature cycling conditions may have considerable influences on the reliability and performance of the semiconductor device. As such, maintaining the $T_j$ below a maximum junction temperature, $T_{j,max}$ (e.g., junction temperature below which the semiconductor device operates in a non-degrading fashion) and maintaining $T_j$ ripple within a desirable range are important considerations during the design stage to improve reliability and enable a longer life cycle for the semiconductor device, and thus the improved reliability and longer life cycle of a power electronics system that includes a number of such semiconductor devices.

One approach to determine the $T_j$ may be to estimate the $T_j$ based on the predicted performance and/or thermal properties of the semiconductor device (e.g., the junction temperature is estimated using predicted device loss with estimated thermal impedance). However, the accuracy of this $T_j$ estimation remains questionable because it depends heavily on the accuracies of other estimations (e.g., device loss estimation, thermal impedance estimation). In addition, some of the thermal and electrical performance of a semiconductor device may also change during its operational lifetime, which makes it even more challenging to estimate the $T_j$. Accordingly, the present disclosure provides systems and methods are directed to in-situ or online monitoring of the $T_j$, as opposed to merely estimating the $T_j$. The present method of $T_j$ monitoring is based on thermosensitive electrical parameters of the device. In particular, the disclosed method is based on the present recognition that a first gate current peak, $I_{gate\_pk}$, of a semiconductor device has a strong correlation with the resistance of the total gate loop of the device. Therefore, it is presently recognized that, when the variation in internal gate resistance with different temperatures is known, $I_{gate\_pk}$ can be used to determine device $T_j$.

Figure 2:
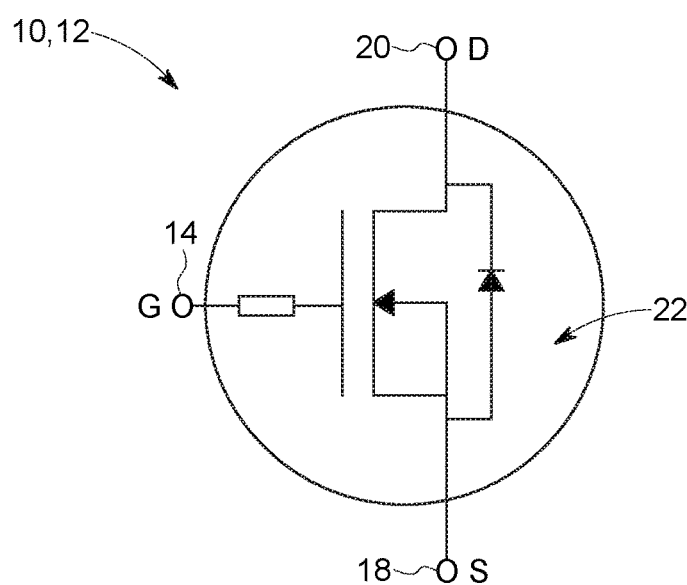
FIG. 2 is a schematic view of the semiconductor device of FIG. 1, in accordance with present embodiments.

FIG. 1 is a cross-sectional view of an embodiment of a semiconductor device or power device 10 that may be used as a semiconductor switch in a power electronics system. In the illustrated embodiment, the semiconductor device 10 is a silicon carbide (SiC) power metal oxide semiconductor field effect transistor (MOSFET) 12. The power MOSFET 12 has a gate 14, as well as a vertical structure 16 having source terminals 18 and a drain terminal 20 disposed at opposite sides of the vertical structure 16. The power MOSFET 12 also includes a body diode 22 (e.g., an intrinsic body diode) formed in a body-drain p-n junction connected between the drain terminal 20 and the source terminal 18. FIG. 2 is a schematic view of the power MOSFET 12. In this case, the power MOSFET 12 is an n-channel MOSFET, which may also be used in conjunction with the techniques disclosed herein.

The semiconductor device 10 operates in a non-degrading fashion when its junction temperature, $T_j$, is maintained below a specified maximum junction temperature, $T_{j,max}$. Thus, it is important to monitor and maintain $T_j$ of the semiconductor device 10 below $T_{j,max}$. As set forth above, it is challenging to accurately estimate the $T_j$, and furthermore, direct measurements of $T_j$ (e.g., via optical measurement or direct contact measurement) may not be practical. For example, direct measurements of the $T_j$ may compromise the integrity of the device packaging, and/or greatly expand the footprint of the packaging, and/or may provide erroneous measurements that are representative of a local point and not a wide-area average.

Figure 3:
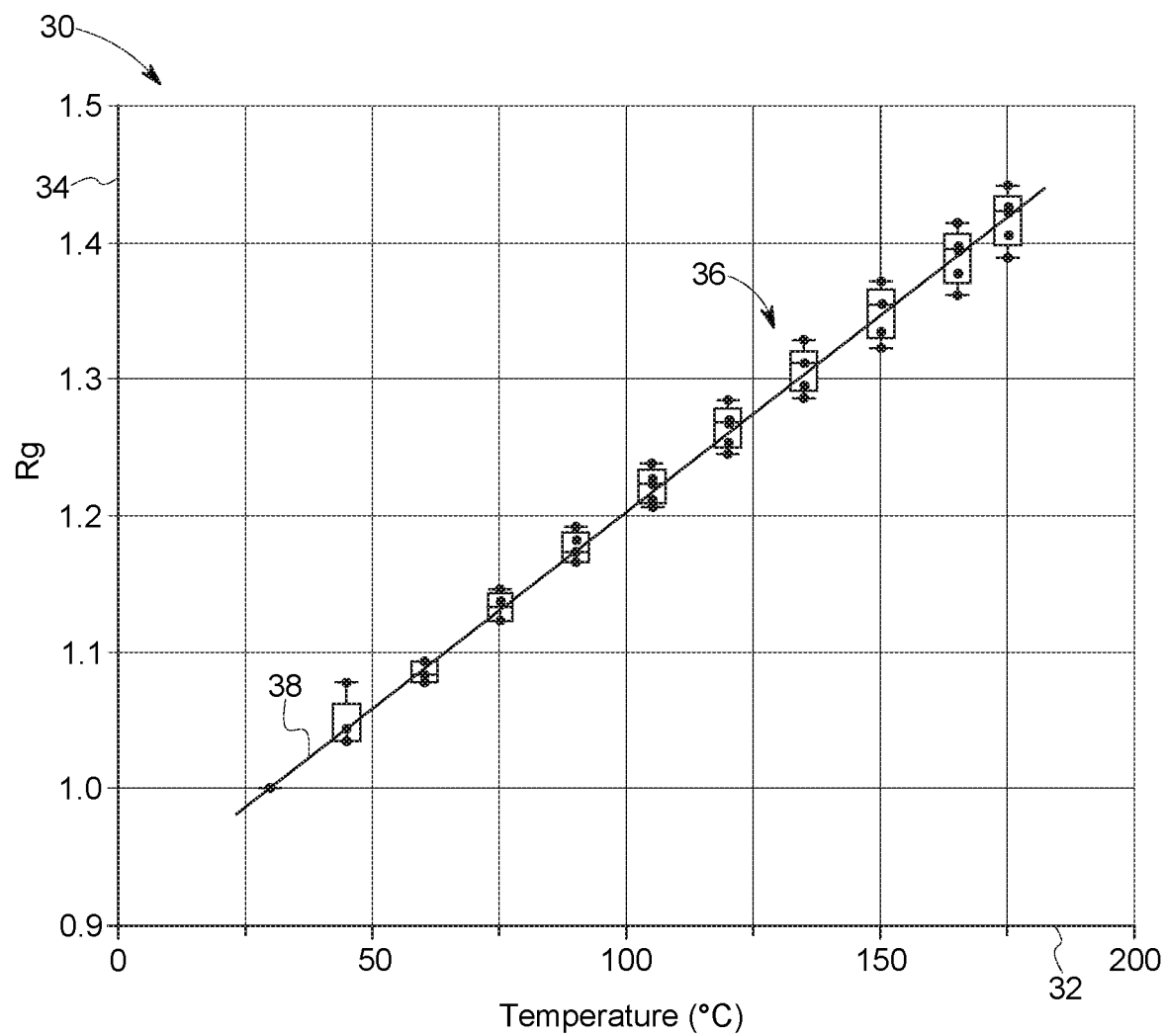
FIG. 3 is a plot illustrating temperature dependent characteristics of an internal gate resistance, $R_{int}$, of the semiconductor device of FIG. 1, in accordance with present embodiments.

It is now recognized that certain temperature-dependent electrical parameters of the semiconductor device 10 can be directly measured and are indicative of $T_j$. FIG. 3 is a plot 30 illustrating temperature-dependent characteristics of the internal gate resistance, $R_{int}$, of the semiconductor device 10, in accordance with present embodiments. In the illustrated embodiment, the semiconductor device 10 is a 1.7 kilo-volts (kV), TO-247 package, SiC MOSFET (e.g., the power MOSFET 12). The 1.7 kilo-volts (kV), TO-247 package, SiC MOSFET is on a die configured to be heated while the $R_{int}$ of the SiC MOSFET is measured as the temperature of the die increases. As shown in the plot 30, the horizontal axis 32 represents the temperature of the die of the power MOSFET 12 in degrees Celsius (° C.) and the vertical axis 34 represents a normalized internal gate resistance, $R_g$, of the power MOSFET 12. In particular, the normalized internal gate resistance $R_g = R_{int}/R_0$, wherein $R_0$ is the internal gate resistance at 25° C. and $R_g$ is $R_{int}$ normalized with respect to $R_0$ at 25° C. The $R_{int}$ of the power MOSFET 12 is related to an internal resistor temperature coefficient, k, and temperature according to equation (1):

$$R_{int} = R_0(1 + k \cdot \Delta T) \quad (1),$$

where $R_0$ represents the internal gate resistance at 25° C., k represents the internal resistor temperature coefficient, and $\Delta T$ represents a temperature variation (e.g., increase in temperature relative to 25° C.).

In the illustrated embodiment, series 36 represent $R_g$ values obtained as the die temperature increases from about 25° C. to about 175° C. A linear extrapolation 38 of the series 36 indicates that the SiC MOSFET 10 has a positive k that increases approximately 35% as the die temperature increases from about 25° C. to about 175° C. Because the $R_{int}$ is integrated inside the die, the temperature dependent characteristics set forth above may well represent the temperature dependent characteristics of the real-time $T_j$. Accordingly, it is presently recognized that there exists a strong correlation between the $R_{int}$ and $T_j$, and this correlation can be used to monitor the $T_j$ of the semiconductor device 10 during operation (e.g., real-time, online temperature monitoring), as will be discussed below.

Figure 4:
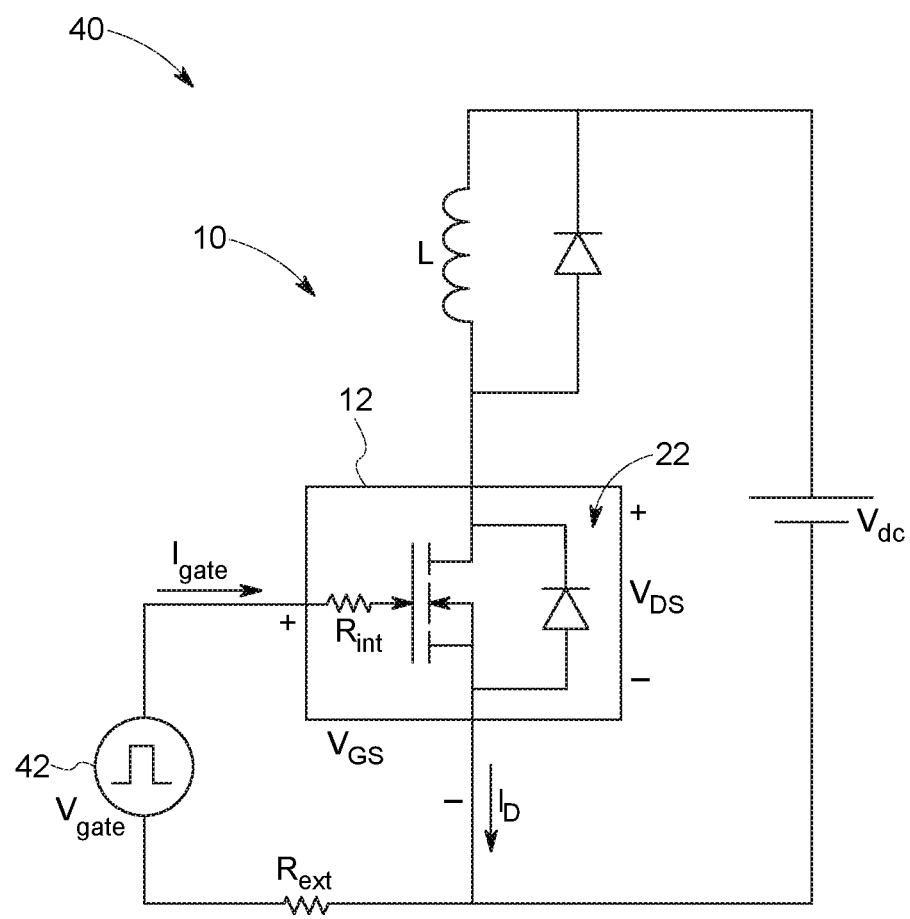
FIG. 4 is a schematic view of a switching circuit of the semiconductor device of FIG. 1, in accordance with present embodiments.

It is now recognized that, based on the understanding of the MOSFET switching process, it is possible to transform a temperature-induced change in internal gate resistance into an electrical signal that can be monitored to indirectly determine $T_j$ of of the semiconductor device 10. FIG. 4 illustrates a schematic of a MOSFET gate loop 40 having inductive load in a phase leg form, in accordance with present embodiments. As illustrated, the gate loop 40 includes a gate driver 42 configured to generate a gate driver voltage, $V_{gate}$, to turn on/off the power MOSFET 12 and allow a gate current, $I_{gate}$, to ramp up/down according to an inductor value, L, and a gate-source voltage, $V_{GS}$, of the power MOSFET 12. The gate loop 40 includes the $R_{int}$, and an external gate resistance, $R_{ext}$, that may be configured to control the switching speed of the gate loop 40. It should be noted that the power MOSFET 12 is configured to output a direct current (DC) voltage, $V_{DC}$, and the power MOSFET 12 enters an active region at $V_{GS}$. The source-drain voltage, $V_{DS}$, is a source-drain voltage at rated current with $V_{GS}=0$ (e.g., it is the forward voltage drop of the body diode 22 when carrying the rate current). The drain current, $I_D$, is the current when a source-drain voltage, $V_{DS}$, is at 100% of the rated voltage with $V_{GS}=0$.

Figure 5:
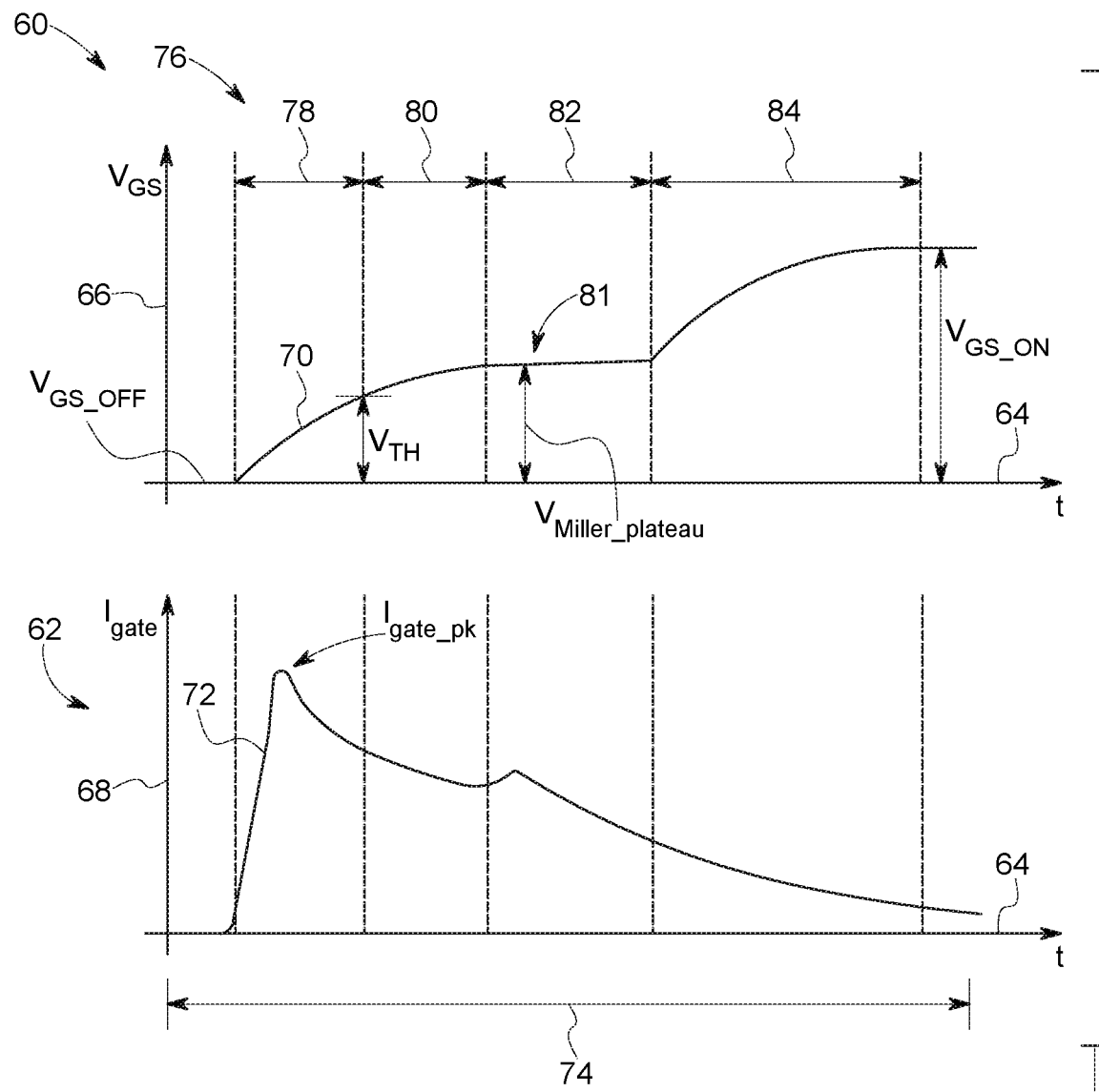
FIG. 5 is a correlated pair of graphs illustrating example gate loop waveforms of the semiconductor device of FIG. 1 during a turn-on event in a switching cycle, in accordance with present embodiments.

FIG. 5 shows graphs illustrating example gate loop waveforms of the power MOSFET 12 during a turn-on event. A graph 60 shows the $V_{GS}$ waveform, synchronized with and disposed above a graph 62 of the $I_{gate}$ waveform. In each of the graphs 60 and 62, the horizontal axis 64 represents time. In the graph 60, the vertical axis 66 represents voltage, while in the graph 62, the vertical axis 68 represents current. In the graph 60, the $V_{GS}$ waveform is represented by a line 70, and in the graph 62, the $I_{gate}$ waveform is represented by a line 72.

A turn-on phase 74 may include multiple sub-phases 76 that transition the power MOSFET 12 from an off gate-emitter voltage, $V_{GS\_OFF}$, to an on gate-emitter voltage, $V_{GS\_ON}$. The multiple sub-phases 76 include a first sub-phase 78, a second sub-phase 80, a third sub-phase 82, and a fourth sub-phase 84. In the first sub-phase 78, the $I_{gate}$ charges the parasitic capacitance of the power MOSFET 12 as the gate-source voltage, $V_{GS}$, ramps up to the threshold voltage, $V_{TH}$ (e.g., voltage that is required to create a conducting path between the source and drain terminals) of the power MOSFET 12. As the $V_{GS}$ approaches the $V_{TH}$, the $I_{gate}$, climbs, peaks at a first gate current peak, $I_{gate\_pk}$, and decreases slightly. The first sub-phase 78 is often referred as the "turn on delay time." In cases that the $V_{GS}$ is low, the $I_{gate\_pk}$ may be reached in a short period of time, such as tens of nanoseconds. In the second sub-phase 80, the drain current, $I_D$, of the power MOSFET 12 rises as the $I_{gate}$ continues charging the $V_{GS}$ to a plateau value, $V_{plateau}$. The plateau 81 is referred to as a Miller plateau. In the third sub-phase 82, the $V_{GS}$ maintains at the plateau value, $V_{plateau}$, as the $I_{gate}$ charges the Miller capacitor. In the fourth sub-phase 84, all of the switching transitions (e.g., switching from an off-state to an on-state) are completed, the $V_{GS}$ increases or charges to the on gate-emitter voltage, $V_{GS\_ON}$, as the $I_{gate}$ falls to approximately zero.

Though the graphs 60 and 62 of FIG. 5 show a single off-on cycle, it should be understood that, in practice, the gate loop 40 goes through many switching cycles. The waveforms shown in the graphs 60 and 62 may also be differently shaped, depending on different operation conditions. For example, the plateau value, $V_{plateau}$, may change depending on the gate current, $I_{gate}$. The input capacitance, $C_{iss}$, of the power MOSFET 12, and thus at least a portion of the waveforms of the graphs 60 and 62, may change depending on the DC voltage, $V_{dc}$, of the power MOSFET 12. Additionally, the threshold voltage, $V_{TH}$, may change depending on temperature. However, it is now recognized that the first gate current peak, $I_{gate\_pk}$, is substantially only influenced by the gate driver voltage, $V_{gate}$, and the gate loop resistance (e.g., the internal gate resistance, $R_{int}$, and the external gate resistance, $R_{ext}$) in gate loop 40. In particular, the first gate current peak, $I_{gate\_pk}$, may be calculated using equation (2):

$$I_{gate\_pk} \approx \frac{V_{gate}}{R_{ext} + R_{int}(1 + k \cdot \Delta T)}, \quad (2)$$

where k represents the internal resistor temperature coefficient as discussed in FIG. 3, and $\Delta T$ represents a temperature variation (e.g., with respect to 25° C.).

Because $V_{gate}$ and $R_{ext}$ are both known controllable variables for the respective gate loop 40, if the internal gate resistance variation with temperature variations is known (e.g., $R_{int}(1+k\Delta T)$ is known), the first gate current peak, $I_{gate\_pk}$ may be used to determine the junction temperature, $T_j$, based on equation (1). That is, $I_{gate\_pk}$ may be decoupled from the operating conditions (e.g., the gate current, $I_{gate}$, the DC voltage, $V_{dc}$), and used as a parameter to determine or calculate the real-time $T_j$ based on the equation (2). As such, it is now recognized that in-situ or online monitoring of the $T_j$ can be achieved by monitoring of the $I_{gate\_pk}$, as set forth herein.

Figure 6:
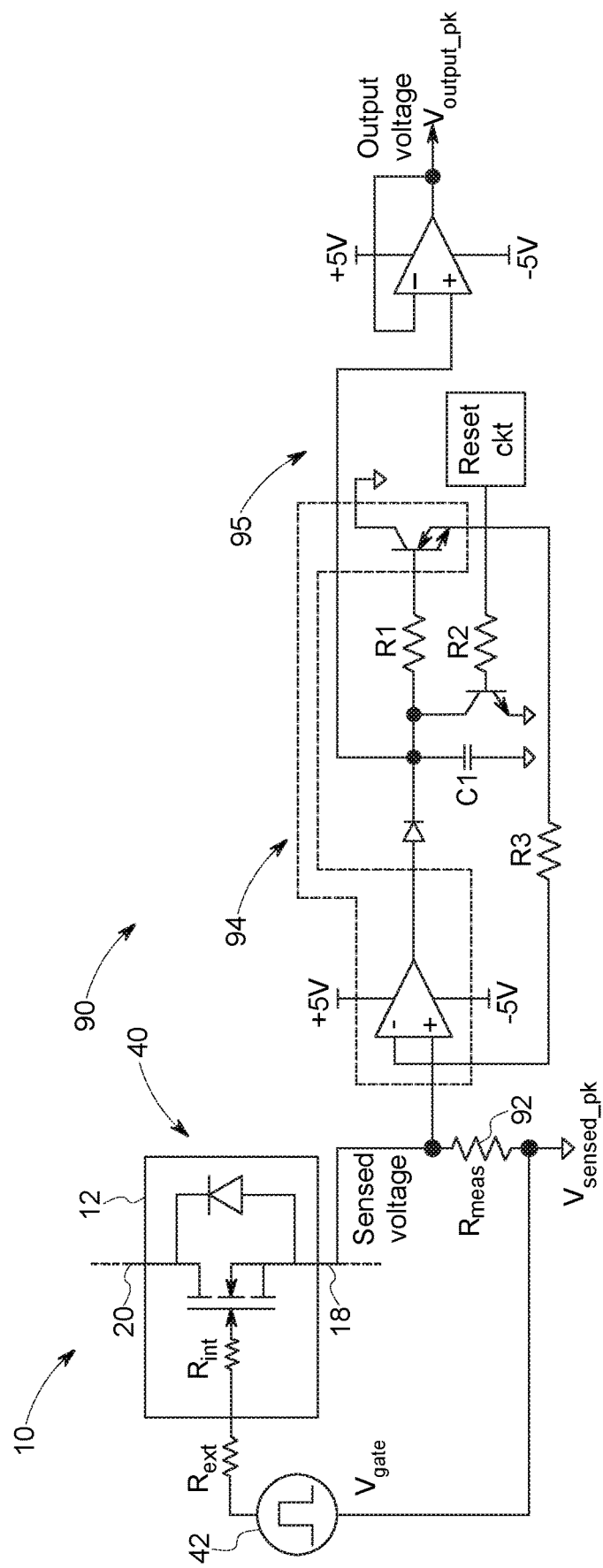
FIG. 6 is a schematic view of a detection circuit configured to determine a voltage across a sensing resistor of the detection circuit that corresponds to a first gate current peak, $I_{gate\_pk}$, of the semiconductor device of FIG. 1 during a turn-on event, in accordance with present embodiments.

FIG. 6 shows a schematic of a detection circuit 90 configured to detect or measure an electric signal relating to the first gate current peak, $I_{gate\_pk}$, of the gate loop 40. In the illustrated embodiment, the detection circuit 90 includes a sensing resistor 92 coupled to the source terminal 18 of the MOSFET 12, as well as a voltage detection circuit 94 and an analyzing circuit 95 configured to determine a voltage, $V_{ouput\_pk}$, attributed by the first gate current peak, $I_{gate\_pk}$. The voltage detection circuit 94 may be configured to detect voltage, $V_{output}$, across the sensing resistor 92 during switching cycles, and the analyzing circuit 95 may be configured to determine the $V_{ouput\_pk}$ based on the sampled $V_{output}$ values from the voltage detection circuit 94. The voltage detection circuit 94 may include an ultra-fast peak voltage detection circuit capable of achieving at least about 700 mega-hertz (MHz) bandwidth (e.g., such as OPA615 available from Texas Instruments, Inc., headquartered in Dallas, Tex., United States). Furthermore, the voltage detection circuit 94 may be disposed in close proximity to the gate driver 42, such that the voltage detection circuit 94 is sufficiently close to detect the $V_{output}$ with a high precision (e.g., capable of detecting tens of nanosecond-width peak voltage). The sensing resistor 92 may have sufficiently high-precision to reduce the sensitivity of the sensing resistor 92 to temperature, thus making the internal gate resistance, $R_{int}$, the only temperature variable parameter in the gate loop 40. For example, in certain embodiments, the sensing resistor 92 may be a 1 Ohmn (Ω) high-precision resistor and the corresponding temperature coefficient of resistance (TCR) values may be as low as ±0.2 parts per million per degree Celsius (ppm/° C.).

Figure 7:
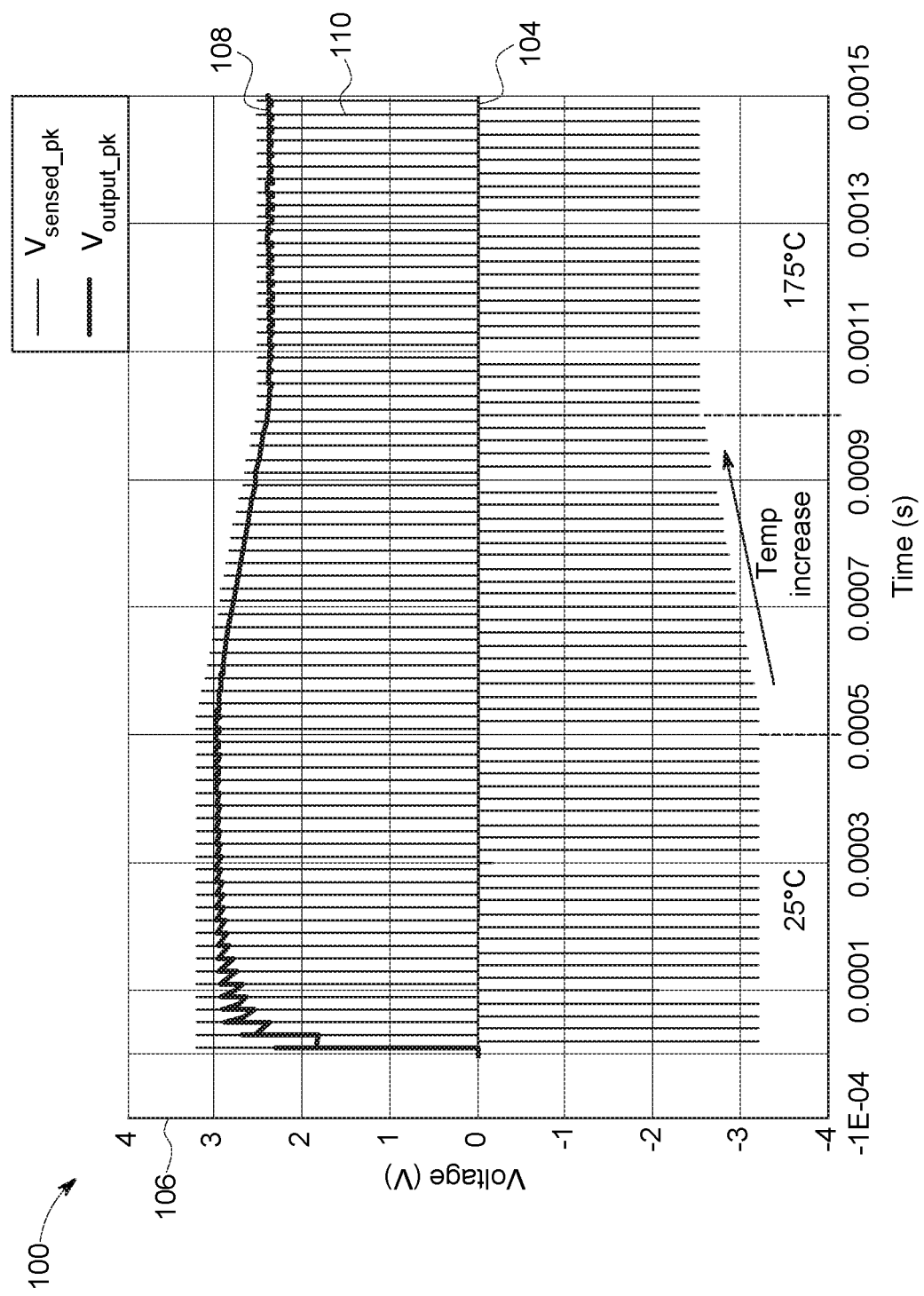
FIGS. 7 and 8 are graphs illustrating a comparison between the voltage (e.g., voltage corresponding to the first gate current peak, $I_{gate\_pk}$) determined via the detection circuit of FIG. 6 and via a potential voltage differential probe, in accordance with present embodiments.
Figure 8:
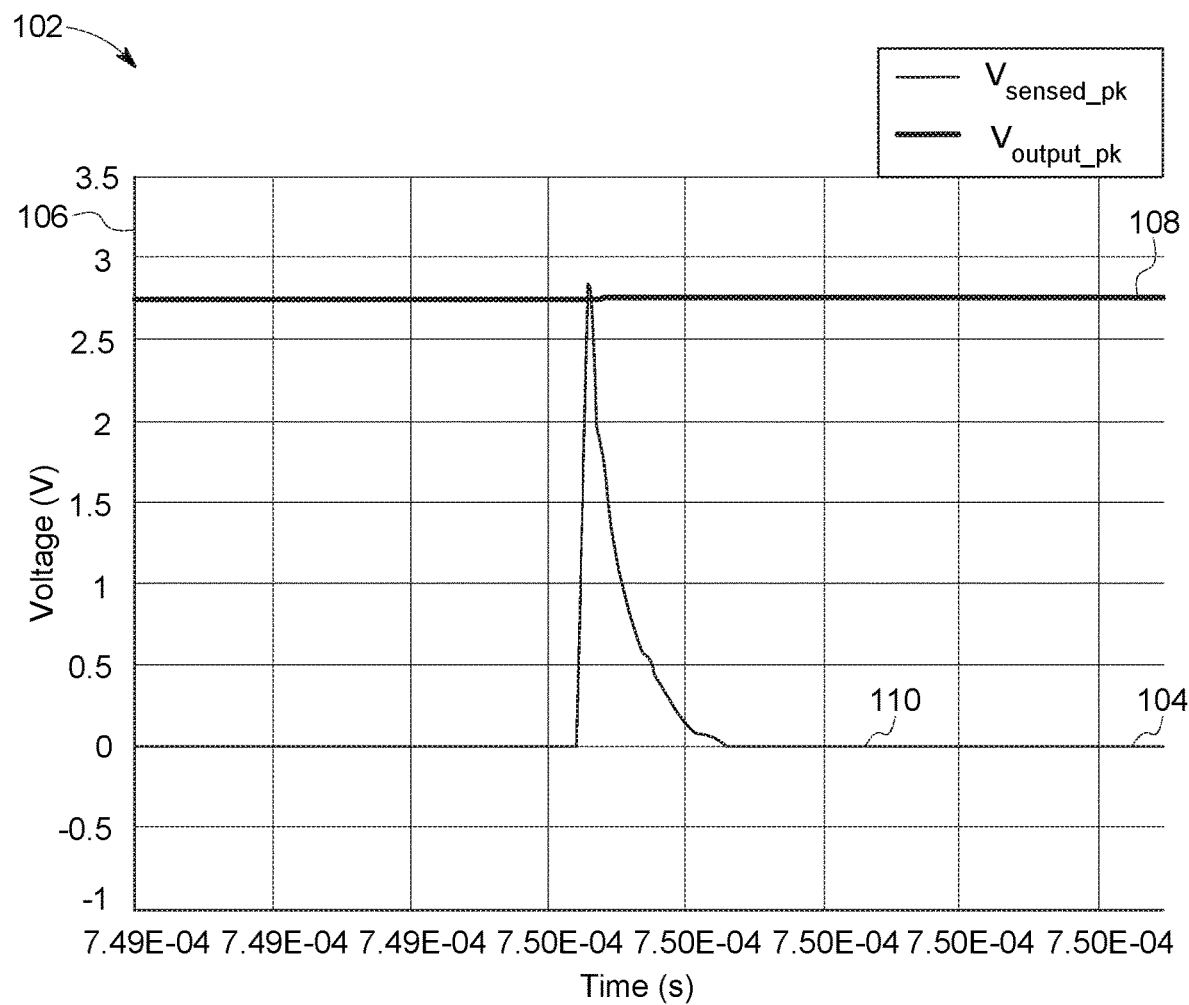

To validate the present concept and verify that the voltage detection circuit 94 and the analyzing circuit 95 can accurately detect and determine $V_{output\_pk}$, a voltage differential probe may be used to detect the voltage attributed by $I_{gate\_pk}$ and $R_{meas}$ for comparison. The voltage detected by the voltage differential probe denotes, $V_{sensed\_pk}$. FIGS. 7 and 8 are graphs 100 and 102 illustrating a simulated comparison between the $V_{output\_pk}$ (e.g., detected and determined by the voltage detection circuit 94 and the analyzing circuit 95) and the $V_{sensed\_pk}$ (e.g., detected by the voltage differential probe). In both of the graphs 100 and 102, the horizontal axis 104 represents time in seconds (s), and the vertical axis 106 represents voltage in volts (V). In the graph 100, series 108 and 110 represent the voltage profiles of $V_{output\_pk}$ and $V_{sensed\_pk}$, respectively, as the temperature of the die (e.g., the gate loop 40 disposed thereon) increases from about 25° C. to about 175° C. with time. As illustrated, series 108 and 110 generally overlap with one another, indicating that $V_{output\_pk}$ (e.g., detected by the voltage detection circuit 94 and the voltage) and $V_{sensed\_pk}$ (e.g., detected by the voltage differential probe) are in close agreement with one another. The graph 102 represents a zoomed-in view of the graph 100 around a time of about $7.5 \times 10^{-4}$ s. As illustrated, both $V_{output\_pk}$ and $V_{sensed\_pk}$ are detected to be about 2.7 V. The close agreement between the $V_{output\_pk}$ and $V_{sensed\_pk}$ values indicates the detection circuit 90 of FIG. 6 is reliable to accurately detect $V_{output\_pk}$.

For the schematic of FIG. 6, the first gate current peak, $I_{gate\_pk}$, may be determined based on the monitored $V_{output\_pk}$ (e.g., $I_{gate\_pk} = V_{output\_pk}/R_{meas}$). Furthermore, the $I_{gate\_pk}$ correlates to the temperature variation, $\Delta T$ (e.g., relative to 25° C.) according to equation (32):

$$I_{gate\_pk} \approx \frac{V_{gate}}{R_{ext} + R_{int} + R_{meas}} = \frac{V_{gate}}{R_{ext} + R_0(1 + k \cdot \Delta T) + R_{meas}} \quad (3)$$

The internal resistor temperature coefficient, k, may be determined using the $I_{gate\_pk}$ obtained from a turn-on event of the semiconductor device. Once the value of k is determined, equation (3) may be used to determine $\Delta T$, and thus $T_j$, for each subsequent $I_{gate\_pk}$ monitored using the detection circuit 90.

Figure 9:
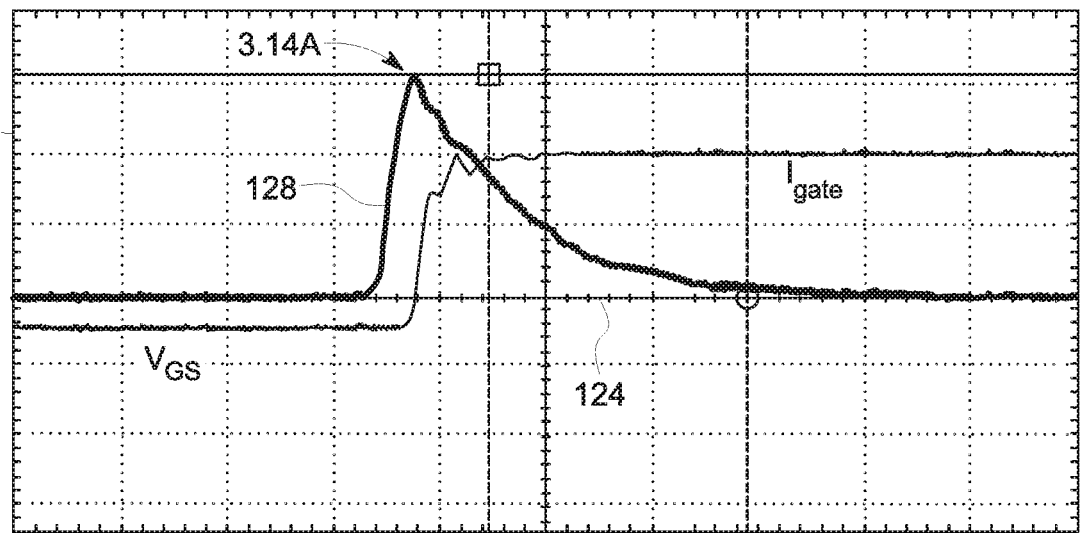
FIGS. 9 and 10 are gate loop waveforms of the semiconductor device of FIG. 1 switched at 25 degrees Celsius (° C.) and at 125° C., in accordance with present embodiments.
Figure 10:
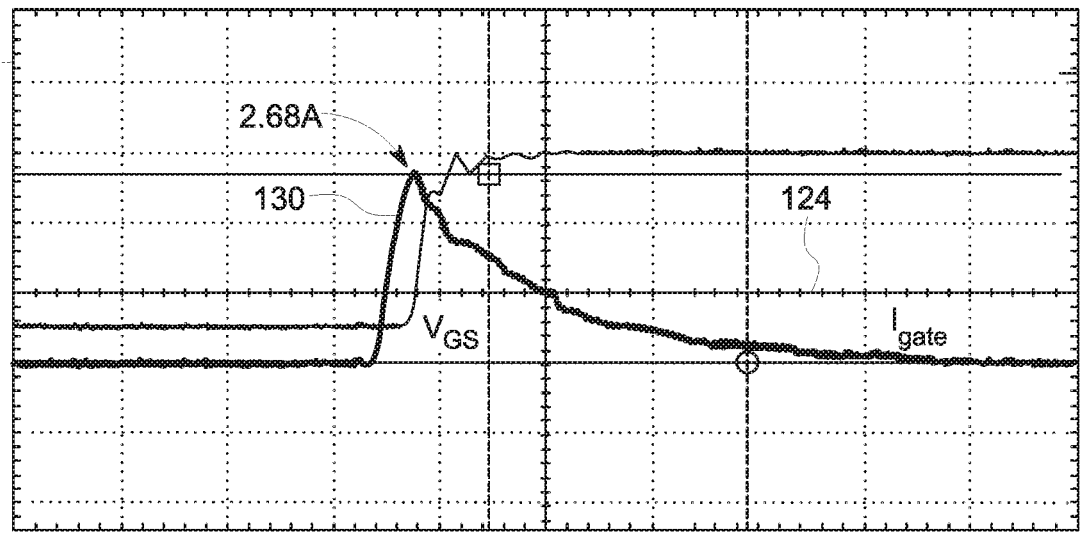

As an example, according to equation (3), gate loop waveforms of the semiconductor device during a turn-on event at 25° C. and at 125° C. are shown in FIGS. 9 and 10, respectively. In graphs 120 and 122 of FIGS. 9 and 10, the horizontal axis 124 represents time in nanoseconds (ns), while the vertical axis 126 represents current in ampere (A). The graph 120 shows a waveform 128 of gate current, $I_{gate}$, as the gate loop 40 undergoes a turn-on event at 25° C. As illustrated, the $I_{gate}$ at 25° C. ramps up to the first gate current peak, $I_{gate\_pk}$, of 3.14 A and the internal gate resistance, $R_{int}$, is about 5.1Ω. The graph 122 shows a waveform 130 of the $I_{gate}$ when the gate loop 40 undergoes a turn-on event at 125° C. As illustrated, the $I_{gate}$ at 125° C. ramps up to the $I_{gate\_pk}$ of 2.68 A. The $I_{gate\_pk}$ is reduced from 3.14 A at 25° C. to 2.68 A at 125° C. because the internal gate resistance, $R_{int}$, increases about 25% from 25° C. to 125° C.

The results shown in FIGS. 9 and 10 indicate that the $I_{gate\_pk}$ is an effective parameter that transforms temperature-based internal gate resistance changes to an electrical signal that can be monitored. That is, the first gate current peak, $I_{gate\_pk}$, has a strong correlation with the total resistance (e.g., $R_{ext}+R_{int}+R_{meas}$) of the gate loop 40 and, therefore, can be used to monitor the junction temperature, $T_j$, using equation (3), given the relationship (e.g., nearly linear relationship shown in FIG. 3) of the internal gate resistance variation with different temperatures is known or can be determined. The detection circuit 90 may monitor data across one or more switching cycles to monitor $I_{gate\_pk}$ that may be converted back to $T_j$ according to equation (3). In practice, because $T_j$ is not expected to exhibit abrupt change, the detection circuit 90 may be used to provide continuous online (e.g., in-situ) temperature monitoring of the semiconductor device 10.

Figure 11:
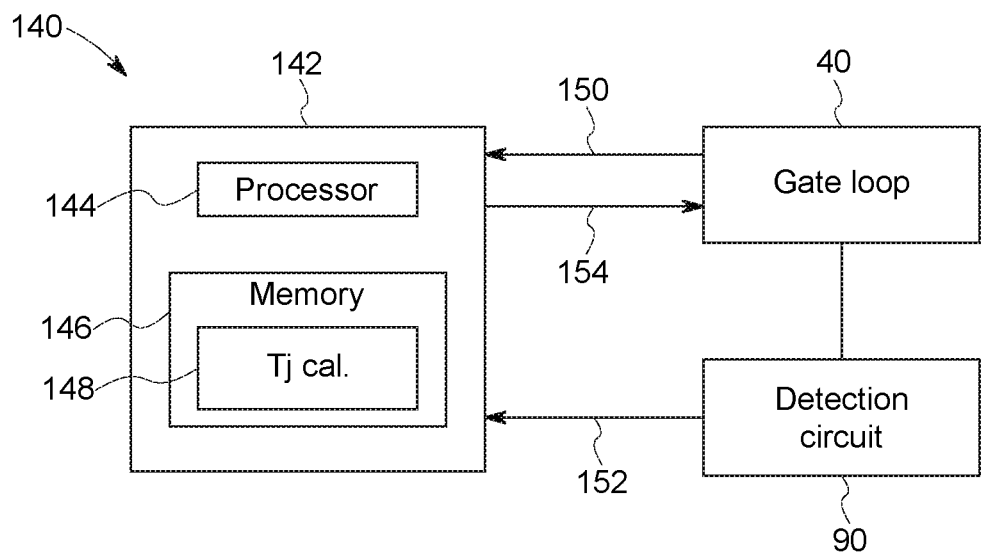
FIG. 11 is a schematic of a junction temperature monitoring system configured to monitor the junction temperature, $T_j$, during operation of the semiconductor device of FIG. 1, in accordance with present embodiments.

FIG. 11 is a schematic of an embodiment of a junction temperature monitoring system 140 configured to monitor junction temperature, $T_j$, during operation of the semiconductor device 10. The junction temperature monitoring system 140 may include an electronic control unit (ECU) 142, such as a field programmable gate array (FPGA), a microcontroller, or other suitable processing device. The ECU 142 is communicatively and/or operatively coupled to the gate loop 40 and the detection circuit 90. In the illustrated embodiment, the ECU 142 includes a processor 144 and a memory 146 that cooperate to store and execute instructions to monitor and/or control the junction temperature, $T_j$, of the semiconductor device 10. In particular, the ECU 142 may include a junction temperature calculation circuitry 148. The ECU 142 may be configured to receive electrical signals from the gate loop 40 and the detection circuit 90, relating to $T_j$ determination. These received electrical signals may be processed by the junction temperature calculation circuitry 148 to determine the $T_j$. For example, the junction temperature calculation circuitry 148 may receive an electrical signal 150 indicating the gate driver voltage, $V_{gate}$, and an electrical signal 152 indicating the $V_{output\_pk}$ and/or $I_{gate\_pk}$ determined by the detection circuit 90. Based on the electrical signals 150 and 152, the junction temperature calculation circuitry 148 may calculate $T_j$ using equation (3). In some embodiments, the ECU 142 may send instructions to the gate loop 40 to control signal output to the gate driver 42 to initiate turn-on or turn-off of the semiconductor device 10 in order to control the $T_j$ within a predetermined operational window. For example, the 142 may send a control signal 154 to the gate driver 42 indicating turn-on, turn-off, switching frequency, and any other suitable operation parameters of the semiconductor device 10.

Figure 12:
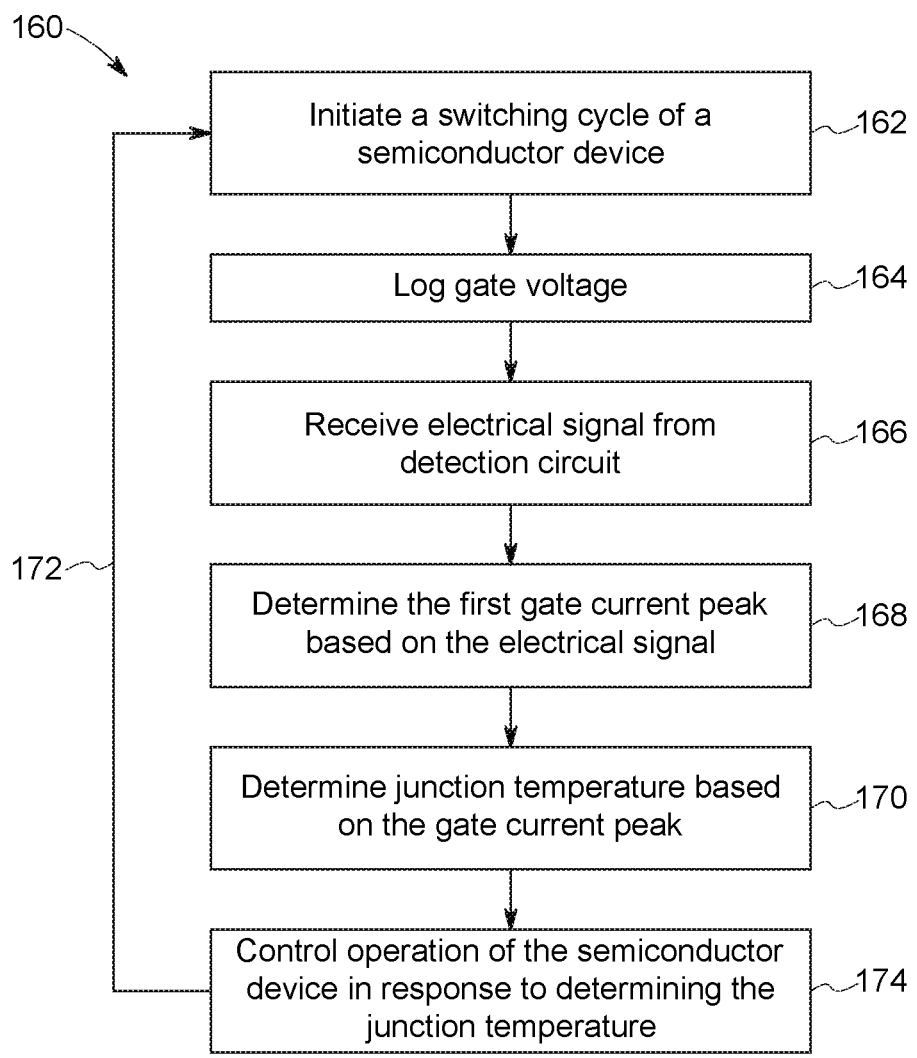
FIG. 12 is a flow chart of a method for monitoring the junction temperature, $T_j$, using the junction temperature monitoring system of FIG. 11.

FIG. 12 is a flow chart of an embodiment of a method 160 for monitoring the junction temperature, $T_j$, in accordance with the presently disclosed technique. Referencing to the FIGS. 6 and 11, the method 160 includes initiating (step 162) a switching cycle of the semiconductor device 10. For example, the ECU 142 may send the control signal 154 to the gate driver 42 to switch the semiconductor device 10 from an off-state to an on-state. The method 160 includes logging (step 164) the gate voltage, $V_{gate}$. As illustrated in FIG. 11, the junction temperature calculation circuitry 148 may receive the electrical signal 150 from the gate loop 40 indicating the gate driver voltage, $V_{gate}$. The method 160 of FIG. 12 includes receiving (step 166) electrical signal from the detection circuit 90. In particular, the junction temperature calculation circuitry 148 may receive the electrical signal 150 indicating the $V_{output\_pk}$ and/or $I_{gate\_pk}$ determined by the detection circuit 90. The method 160 includes determining (step 168) the first gate current peak, $I_{gate\_pk}$, based on the electrical signal 150. Specifically, the junction temperature calculation circuitry 148 may calculate the first gate current peak, $I_{gate\_pk}$ (e.g., $I_{gate\_pk}=V_{output\_pk}/R_{meas}$). Subsequently, the method 160 includes determining (step 170) the junction temperature, $T_j$, based on the first gate current peak, $I_{gate\_pk}$. The junction temperature calculation circuitry 148 may be pre-loaded with a look-up table storing values for the internal resistor temperature coefficient, k, or may determine k based on data monitored by the detection circuit 90. Once the value of k is known, the junction temperature calculation circuitry 148 may calculate ΔT, and then determine $T_j$ based on the monitored $I_{gate\_pk}$ according to equation (3).

In some embodiments, the method 160 includes controlling (step 174) operation of semiconductor device 10 in response to determining the junction temperatures, $T_j$. Specifically, the ECU 142 may compare the $T_j$ value(s) determined in step 170 to a pre-determined value or range and adjust operating parameters (e.g., turn-on, turn-off, switching frequency, and any other suitable parameters) of the semiconductor device 10 based on the comparison. For example, the ECU 142 may determine that the monitored $T_j$ is above the pre-determined value or range and may send the control signal 154 to the gate driver 42 in the gate loop 40 to turn-off the semiconductor device 10 and/or to reduce the switching frequency of the semiconductor device 10. For example, the ECU 142 may determine that the monitored $T_j$ is below the pre-determined value or range and may send the control signal 154 to the gate driver 42 in the gate loop 40 to increase the switching frequency of the semiconductor device 10. In some embodiments, the method 160 may repeat the steps 162 to 174 as indicated by arrow 172 to determine the junction temperatures, $T_j$, in multiple switching cycles (e.g., repeated on-off switching of the semiconductor device 10). As such, the junction temperatures, $T_j$, may be monitored online and in-situ during operation of the semiconductor device 10.

In certain embodiments, the disclosed system may be used in combination with one or more semiconductor device structures disclosed in U.S. patent application Ser. No. 15/643,146, entitled "GATE NETWORKS HAVING POSITIVE TEMPERATURE COEFFICIENTS OF RESISTANCE (PTC) FOR SEMICONDUCTOR POWER CONVERSION DEVICES" filed Jul. 6, 2017, which is incorporated by reference herein in its entirety for all purposes. As used herein, a "gate network" refers to components of a power conversion device that are part of the electrical pathway between the gate pad metal and plurality of active device cells. As such, a gate network may include, for example, a gate pad (potentially having an integrated resistor network, as discussed below), gate buses, and gate electrodes of a power conversion device. The term "non-zero temperature coefficient of resistance (NZTC)" is used herein to describe device components and materials having a resistivity that substantially changes with temperature over a particular temperature range, such as those having a positive temperature coefficient of resistance or a negative temperature coefficient of resistance. The term "positive temperature coefficient of resistance (PTC)," also referred to herein as positive temperature coefficient of resistance (positive TCR), is used herein to describe device components and materials having a resistivity that increases with increasing temperature, and that decreases with decreasing temperature, over a particular temperature range. The term "negative temperature coefficient of resistance (NTC)," also referred to herein as negative temperature coefficient of resistance (negative TCR), is used herein to describe device components and materials having a resistivity that decreases with increasing temperature, and that increases with decreasing temperature, over a particular temperature range. A temperate coefficient of resistance of a material has units in parts per million per degree Celsius (ppm/° C.) and is calculated according to equation (4):

$$TCR = \left( \frac{(R(T_{high}) - R(T_{low}))/R(T_{low})}{T_{high} - T_{low}} \right) \times 10^6 \quad (4)$$

wherein R(T) is the resistance of the material at a particular temperature (T), while $T_{high}$ and $T_{low}$ represent the range of temperatures over which the material changes resistance. As used herein, "$R_g$" represents and refers to the total equivalent series resistance of the transistor gate of a power conversion device. It should be understood that, in certain embodiments, there may be also be an external resistance component (i.e., $R_{g\text{-}external}$) that is separate distinct from $R_g$ and that may have a value of zero or more.

Such device structures include semiconductor power conversion devices (e.g., SiC MOSFETs and SiC IGBTs as well as Si MOSFETs and Si IGBTs) that having a gate network with a non-zero (e.g., positive or negative) temperature coefficient of resistance. This NZTC gate network enables a power conversion device to have a variable total equivalent series gate resistance ($R_g$) over a range of typical operating temperatures (e.g., between about 25° C. and about 150° C.) of the power conversion device. This NZTC gate network is generally in thermal proximity to nearby device cells and can vary in resistivity in response to changes in the junction temperature of these cells. The NZTC gate network is generally designed to have suitable resistivity to ensure that the device cell peak voltage remains below a maximum voltage rating ($V_{max}$), avoids ringing, interchip oscillations, and reduces switching losses of the device cells, over the range of typical operating temperatures. Further, the NZTC gate network does not require extra processing steps to implement relative to a gate network that does not have a non-zero (e.g., positive or negative) temperature coefficient of resistance. In particular, for certain embodiments of the present approach, the NZTC gate network may have a positive TCR, as calculated according to Eq. 1, of at least 1000 ppm/° C. (e.g., greater than or equal to 2000 ppm/° C., greater than approximately 2250 ppm/° C., between approximately 2400 ppm/° C. and 3200 ppm/° C.). As such, it is presently recognized that the presently disclosed junction temperature monitoring system can be used to monitor the junction temperature of semiconductor devices, while the VTC gate network of these devices automatically adjusts resistance and device operation in response to this junction temperature.

The technical effects of the present disclosure include improving the accuracy and efficiency of junction temperature monitoring for semiconductor switching devices. The disclosed junction temperature monitoring system is configured to perform online or in-situ monitoring of the first gate current peak, $I_{gate\_pk}$, of a semiconductor switching device. The first gate current peak, $I_{gate\_pk}$, is utilized as a junction temperature indicator to determine the junction temperature, $T_j$, of the semiconductor switching device during the operation of the semiconductor switching device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A system for monitoring a junction temperature of a semiconductor device, comprising:
 a sensing resistor electrically coupled to a source terminal of the semiconductor device in a gate loop of the semiconductor device;
 a detection circuit electrically coupled to the gate loop of the semiconductor device and configured to measure a voltage difference across the sensing resistor; and
 an electronic control unit electrically coupled to the gate loop and the detection circuit, wherein the electronic control unit is configured to:
  determine a first gate current peak during a switching process of the semiconductor device, wherein the first gate current peak is determined based on the voltage difference detected by the detection circuit; and
  determine the junction temperature based on the first gate current peak.

2. The system of claim 1, wherein the electronic control unit is configured to control operation of the semiconductor device in response to determining the junction temperature based on the first gate current peak.

3. The system of claim 1, wherein the semiconductor device comprises a silicon carbide semiconductor device or a metal oxide semiconductor field-effect transistor (MOSFET).

4. The system of claim 1, wherein the first gate current peak occurs during a turn-on event of the semiconductor device and before reaching a Miller plateau of the semiconductor device.

5. The system of claim 1, wherein the sensing resistor comprises a high-precision resistor having a temperature coefficient value lower than about 0.2 parts per million per degree Celsius (ppm/° C.).

6. The system of claim 1, wherein the detection circuit is configured to have a bandwidth higher than about 700 mega-hertz (MHz).

7. The system of claim 1, wherein, to determine the first gate current peak during the switching process of the semiconductor device, the electronic control unit is configured to:
 initiate at least one switching cycle of the semiconductor device by sending a control signal to a gate driver to switch the semiconductor device from an off-state to an on-state; and
 log a gate voltage of the semiconductor device during the at least one switching cycle.

8. The system of claim 1, wherein the gate loop comprises an external gate resistance, an internal gate resistance, and a resistance associated of the sensing resistor.

9. The system of claim 8, wherein the semiconductor device comprises a non-zero temperature coefficient of resistance (NZTC) gate network having a temperature coefficient value that is greater than or equal to 1000 parts per million degree Celsius (ppm/° C.).

10. A semiconductor switch device, comprising:
 a gate driver configured to turn-on and turn-off the semiconductor switch device; and
 a junction temperature monitoring system electrically coupled to the semiconductor switch device and configured to monitor a junction temperature of the semiconductor switch device, wherein the junction temperature monitoring system comprises:
  a sensing resistor electrically coupled to a source terminal of the semiconductor switch device in a gate loop of the semiconductor switch device;
  a detection circuit electrically coupled to the gate loop of the semiconductor switch device and configured to measure a voltage difference across the sensing resistor; and
  an electronic control unit electrically coupled to the gate loop and the detection circuit, wherein the electronic control unit is configured to:
   determine a first gate current peak driven by the gate driver during a switching process of the semiconductor switch device, wherein the first gate current peak is determined based on the voltage difference detected by the detection circuit; and
   determine the junction temperature based on the first gate current peak.

11. The semiconductor switch device of claim 10, wherein the electronic control unit is configured to control operation of the semiconductor switch device in response to determining the junction temperature based on the first gate current peak.

12. The semiconductor switch device of claim 10, wherein the semiconductor switch device comprises a silicon carbide semiconductor device or a metal oxide semiconductor field-effect transistor (MOSFET).

13. The semiconductor switch device of claim 10, wherein the first gate current peak occurs during a turn-on event of the semiconductor switch device and before reaching a Miller plateau of the semiconductor switch device.

14. The semiconductor switch device of claim 10, wherein the gate loop comprises an external gate resistance, an internal gate resistance, and a resistance associated of the sensing resistor.

15. The semiconductor switch device of claim 10, wherein the sensing resistor comprises a high-precision resistor having temperature coefficient values lower than about 0.2 parts per million per degree Celsius (ppm/° C.).

16. The semiconductor switch device of claim 10, wherein the detection circuit is configured to have a bandwidth higher than about 700 mega-hertz (MHz).

17. The semiconductor switch device of claim 10, wherein, to determine the first gate current peak driven by the gate driver during the switching process of the semiconductor switch device, the electronic control unit is configured to:
 initiate at least one switching cycle of the semiconductor switch device by sending a control signal to the gate driver to turn on the semiconductor switch device; and
 log a gate voltage of the semiconductor switch device during the at least one switching cycle.

18. A method of online monitoring a junction temperature of a semiconductor switch, comprising:
 initiating at least one switching cycle of the semiconductor switch;
 logging a gate voltage of the semiconductor switch during the at least one switching cycle;
 receiving an electrical signal from a detection circuit that is electrically coupled to a gate loop of the semiconductor switch, wherein the electrical signal is indicative of a voltage measured across a sensing resistor of the gate loop, and wherein the sensing resistor is electrically coupled to a source terminal of the semiconductor switch;
 determining, by an electronic control unit, a first gate current peak based on the electrical signal; and determining, by the electronic control unit, the junction temperature based on the first gate current peak.

19. The method of claim 18, comprises controlling operation of the semiconductor switch in response to determining the junction temperature based on the first gate current peak.

20. The method of claim 18, wherein initiating the at least one switching cycle comprises sending a control signal to a gate driver to switch the semiconductor switch from an off-state to an on-state.

21. The method of claim 18, wherein determining the first gate current peak comprises determining a current peak that occurs before the semiconductor switch reaches a Miller plateau during a turn-on event of the switching cycle.

* * * * *